(12) United States Patent
Heibel et al.

(10) Patent No.: US 12,131,829 B2
(45) Date of Patent: Oct. 29, 2024

(54) SYSTEM TO DETECT AND LOCATE THE IN-CORE POSITION OF FUEL BUNDLES WITH CLADDING PERFORATIONS IN CANDU-STYLE NUCLEAR REACTORS

(71) Applicant: Westinghouse Electric Company LLC, Cranberry Township, PA (US)

(72) Inventors: Michael D. Heibel, Broomfield, CO (US); Jeffrey L. Arndt, Pittsburgh, PA (US)

(73) Assignee: Westinghouse Electric Company LLC, Cranberry Township, PA (US)

(*) Notice: Subject to any disclaimer, the term of this patent is extended or adjusted under 35 U.S.C. 154(b) by 605 days.

(21) Appl. No.: 17/450,513

(22) Filed: Oct. 11, 2021

(65) Prior Publication Data

US 2022/0084703 A1 Mar. 17, 2022

Related U.S. Application Data

(62) Division of application No. 16/439,061, filed on Jun. 12, 2019, now Pat. No. 11,170,903.

(51) Int. Cl.
*G21C 17/04* (2006.01)
*G01T 1/24* (2006.01)
(Continued)

(52) U.S. Cl.
CPC ............. *G21C 17/044* (2013.01); *G01T 1/24* (2013.01); *G21C 17/041* (2013.01);
(Continued)

(58) Field of Classification Search
CPC .. G21C 17/044; G21C 17/041; G21C 17/047; G21C 17/10; G21C 17/048; G01T 1/24; H01L 31/10; H01L 31/115
(Continued)

(56) References Cited

U.S. PATENT DOCUMENTS 3,070,532 A  5/1958  Zebroski
4,200,491 A  4/1980  Ball
(Continued)

FOREIGN PATENT DOCUMENTS

FR    2483671 A1    5/1980
WO    2020251995 A1    12/2020

OTHER PUBLICATIONS

International Search Report and Written Opinion for International PCT Application No. PCT/US2013/035353, dated Feb. 10, 2014.
(Continued)

*Primary Examiner* — Peter M Poon
*Assistant Examiner* — Daniel Wasil
(74) *Attorney, Agent, or Firm* — K&L Gates LLP

(57) ABSTRACT

A system for detecting a leak in a cladding tube in a nuclear reactor that has a plurality of cladding tubes housed in a plurality of horizontally arranged channels. A plurality of tubes are positioned adjacent to the channels. A plurality of solid state radiation detectors are in each of the tubes. The detectors are spaced from each other along the length of each tube. The detectors can detect the presence of radiation from a selected fission product within a channel. A processor calculates a leak location by receiving signals above a base line level from the detectors, determining differences in signal strength from the detectors over a period of time, and identifying location of the detector emitting the strongest signal.

6 Claims, 6 Drawing Sheets

(51) Int. Cl.
    *G21C 17/10*     (2006.01)
    *H01L 31/10*     (2006.01)
    *H01L 31/115*    (2006.01)

(52) U.S. Cl.
    CPC ......... *G21C 17/047* (2013.01); *G21C 17/048* (2013.01); *G21C 17/10* (2013.01); *H01L 31/10* (2013.01); *H01L 31/115* (2013.01)

(58) Field of Classification Search
    USPC ........................................................ 376/253
    See application file for complete search history.

(56) References Cited

U.S. PATENT DOCUMENTS

| | | |
|---|---|---|
| 4,764,335 A | 8/1988 | Gross et al. |
| 5,057,270 A | 10/1991 | Chevereau |
| 5,333,157 A | 7/1994 | Gross |
| 5,602,886 A | 2/1997 | Gross et al. |
| 5,726,453 A | 3/1998 | Lott et al. |
| 5,745,538 A | 4/1998 | Heibel |
| 5,940,460 A | 8/1999 | Seidel et al. |
| 5,969,359 A | 10/1999 | Ruddy et al. |
| 6,061,412 A | 5/2000 | Stucker et al. |
| 8,681,920 B2 | 3/2014 | Heibel et al. |
| 9,831,375 B2 | 11/2017 | Heibel et al. |
| 10,109,380 B2 | 10/2018 | Heibel et al. |
| 11,170,903 B2 * | 11/2021 | Heibel ................. G21C 17/044 |
| 2004/0178426 A1 | 9/2004 | Melekhov et al. |
| 2007/0235655 A1 | 10/2007 | Rhiger et al. |
| 2007/0290135 A1 | 12/2007 | Manivannan et al. |
| 2010/0219385 A1 | 9/2010 | Miller |
| 2011/0042575 A1 | 2/2011 | Ishii et al. |
| 2011/0284755 A1 | 11/2011 | Stradins et al. |
| 2013/0208844 A1 | 8/2013 | Masugi et al. |
| 2013/0272468 A1 | 10/2013 | Loewen et al. |

OTHER PUBLICATIONS

International Search Report and Written Opinion for International PCT Application No. PCT/US2020/036960, dated Sep. 23, 2020.

* cited by examiner

SYSTEM TO DETECT AND LOCATE THE IN-CORE POSITION OF FUEL BUNDLES WITH CLADDING PERFORATIONS IN CANDU-STYLE NUCLEAR REACTORS

CROSS-REFERENCE TO RELATED APPLICATION

This application is a divisional application claiming priority under 35 U.S.C. § 120 to U.S. patent application Ser. No. 16/439,061, entitled METHOD AND SYSTEM TO DETECT AND LOCATE THE IN-CORE POSITION OF FUEL BUNDLES WITH CLADDING PERFORATIONS IN CANDU-STYLE NUCLEAR REACTORS, the entire disclosures of which are hereby incorporated by reference herein.

BACKGROUND OF THE INVENTION

1. Field of the Invention

The present invention relates to a method and system for detecting the location of in-core nuclear fuel bundles containing one or more fuel rods that have through-wall cladding perforations using an array of solid state radiation detectors calibrated for sensitivity to gamma radiation from select fission products.

2. Description of the Prior Art

A CANDU®-style (Canada Deuterium Uranium) nuclear reactor, such as that shown in part in FIG. 1, utilizes a pressure tube design which uses heavy water as both the moderator and the coolant. The nuclear fuel, or fissile material, is typically uranium dioxide ($UO_2$) pellets housed in a zirconium alloy cladding tube with a number of such cladding tubes organized in bundles within horizontally arranged fuel channels. Coolant flows within the channels around the cladding tube bundles. Occasionally, defects can occur due to things like stress-corrosion cracking, fabrication defects, fretting defects and weld failure, typically in the end caps of the cladding tubes. Regardless of the cause of the defect, fission products and fuel debris can be released into the coolant, contaminating the coolant and risking radiation exposure for personnel.

Fuel defects are currently detected by monitoring the primary coolant for gaseous fission products and radio-iodines, while location in core is usually performed on-power by delayed neutron monitoring of coolant samples from individual fuel channels or off-power by gamma-ray monitoring of the channel feeder pipes. (Reference 2).

Conventional reactors include tubes to house detectors, such as rhodium-based detectors or in more recent years, vanadium flux detectors. Vanadium flux detectors have been shown to provide more accurate power measurement and last considerably longer than rhodium detectors, but neither of the conventional detectors provide a prompt signaling of a defect in fuel bundles. Vanadium detectors, for example, have an inherent fifteen minute delay in signaling reactor power distribution measurements.

The detection and identification of a leaking fuel bundle position inside a CANDU®-style nuclear reactor during operation is currently a very complex, expensive, and uncertain process (See R. D. MacDonald et al., *Detecting, Locating and Identifying Failed Fuel In Canadian Power Reactors*, AECL-9714, February 1990). The determination of exactly what fuel bundle(s) have failed is imprecise and time consuming. This uncertainty makes it difficult to effectively manage fuel channel power and fuel feed rate to minimize the fission product contamination in the coolant system.

SUMMARY OF THE INVENTION

A method for detecting leaks in the fuel rods in a fuel bundle in a nuclear reactor is described herein. In a nuclear reactor having a plurality of fuel bundles housed in a plurality of linearly arranged channels for flowing coolant past the fuel bundles, the method includes monitoring the fuel channels for the occurrence of an increase in normalized measured gamma radiation levels above a specific energy above a selected base line energy intensity, and the subsequent decrease in the selected gamma radiation energy normalized measured intensity in the fuel channel as a function of distance along the length of the channel in the direction of the coolant flow. The changes in gamma radiation level normalized intensity over the length of the fuel channel is indicative of the presence of at least one fission product in the coolant in at least one of the plurality of fuel channels. The method further comprises monitoring the channels for the occurrence of time dependent changes in the strength of radiation in the coolant above the base line along the length of the at least one of the plurality of channels. Monitoring the channels comprises placing a fixed linear array of solid state radiation detectors along the length of a plurality of the channels and taking readings from the array of detectors, the solid state detectors being comprised of a silicon carbide substrate having a first side and a second side, an epitaxial silicon carbide layer on the first side of the substrate, a Schottky contact covering at least a portion of the epitaxial layer, an electron emitter material spaced from the Schottky contact and defining a gap therebetween, each of the gap and the electron emitter material configured to a depth effective for detecting radiation above the base line level consistent with the presence of the at least one fission product. The method also includes triangulating the radiation readings to determine the location of the strongest radiation reading and the location along the length of the channel where the increase in radiation occurred.

In various aspects, the readings are taken from the detectors continuously. In various aspects, the readings are taken from the detectors in pulses. There may be a fixed linear array of detectors along the length of each of the plurality of fuel channels.

Also described herein is a method of detecting a leak in a fuel bundle and identifying the axial and radial location of the leak in the associated fuel channel. In a nuclear reactor having a plurality of fuel rods are positioned within a few bundle and a plurality of fuel bundles are housed in a plurality of linearly arranged channels for flowing coolant past the fuel bundles, the method includes placing a plurality of solid state radiation detectors in each of a plurality of detector tubes positioned adjacent to and generally perpendicular to the plurality of channels. The plurality of radiation detectors are spaced from each other along the length of each detector tube and in sufficiently close proximity to a channel to detect the presence of radiation from a selected fission material within that channel. The radiation detectors comprise a silicon carbide substrate having a first side and a second side, an epitaxial silicon carbide layer on the first side of the substrate, a Schottky contact covering at least a portion of the epitaxial layer, an electron emitter material spaced from the Schottky contact which defines a gap therebetween, wherein each of the gap and the electron emitter material are configured to a depth effective for detecting radiation above a base line level consistent with the presence of the selected fission material. The method also includes monitoring the plurality of detectors to detect signals above the normalized base line level and triangulating the signals from each detector to determine the location of the cladding tube in closest proximity to the detector having the highest normalized signal intensity. When simultaneous fractional increases in normalized detector signal strength occurs in the detectors positioned around a specific fuel channel, the horizontal position of the maximum amount of increase in each affected detector is determined through point radiation source detection as described in Nageswara S. V. Rao, et al, "Identification of Low-Level Point Radiation Sources Using a Sensor Network," Oak Ridge National Laboratory, 2006 (the Rao et al. method)—this is accomplished using geometric difference triangulation. An exponential decay fit of the fractional changes in the measured detector signals nearest to the affected fuel channel, starting from the location of maximum measured detector fraction change is developed. The process is repeated until the desired statistical confidence in the fitted data is obtained using a sequential probability ratio test. The time constant of the exponential decay fitting along the length of the fuel channel obtained is examined to determine whether it is consistent with the decay constants of the target fission products. If the assessment performed is positive, the vertical and horizontal positions of the leaking fuel bundles may be determined by triangulation of the maximum fractional detector in each vertical and radial detector plane using geometric difference triangulation.

Also described herein is a system for detecting a leak in a fuel bundle in a nuclear reactor, wherein the reactor has a plurality of horizontally arranged fuel bundles housed in a plurality of horizontally arranged channels for flowing coolant past the fuel bundles. The system includes, in various aspects, a plurality of tubes positioned adjacent to and generally perpendicular to the plurality of channels, a plurality of solid state radiation detectors in each of the plurality of tubes, the plurality of radiation detectors being spaced from each other along the length of each detector tube and in sufficiently close proximity to a channel to detect the presence of radiation from a selected fission material within said channel. Each of the radiation detectors comprises a silicon carbide substrate having a first side and a second side, an epitaxial silicon carbide layer on the first side of the substrate, a Schottky contact covering at least a portion of the epitaxial layer, an electron emitter material spaced from the Schottky contact and defining a gap therebetween, each of the gap and the electron emitter material configured to a depth effective for detecting radiation above a base line level consistent with the presence of the selected fission material. The system may, in certain aspects also include a processor for receiving radiation signals above the base line and determining differences in signal strength from multiple detectors over a period of time to identify the location of the detector emitting the strongest signal. The selected fission product in various aspects, may be lanthanum 140 having a signal at about 1.4 MeV.

BRIEF DESCRIPTION OF THE DRAWINGS

The characteristics and advantages of the present disclosure may be better understood by reference to the accompanying figures.

DESCRIPTION OF THE PREFERRED EMBODIMENTS

As used herein, the singular form of "a", "an", and "the" include the plural references unless the context clearly dictates otherwise. Thus, the articles "a" and "an" are used herein to refer to one or to more than one (i.e., to at least one) of the grammatical object of the article. By way of example, "an element" means one element or more than one element.

In the present application, including the claims, other than where otherwise indicated, all numbers expressing quantities, values or characteristics are to be understood as being modified in all instances by the term "about." Thus, numbers may be read as if preceded by the word "about" even though the term "about" may not expressly appear with the number. Accordingly, unless indicated to the contrary, any numerical parameters set forth in the following description may vary depending on the desired properties one seeks to obtain in the compositions and methods according to the present disclosure. At the very least, and not as an attempt to limit the application of the doctrine of equivalents to the scope of the claims, each numerical parameter described in the present description should at least be construed in light of the number of reported significant digits and by Further, any numerical range recited herein is intended to include all sub-ranges subsumed therein. For example, a range of "1 to 10" is intended to include any and all sub-ranges between (and including) the recited minimum value of 1 and the recited maximum value of 10, that is, having a minimum value equal to or greater than 1 and a maximum value of equal to or less than 10.

Figure 1:
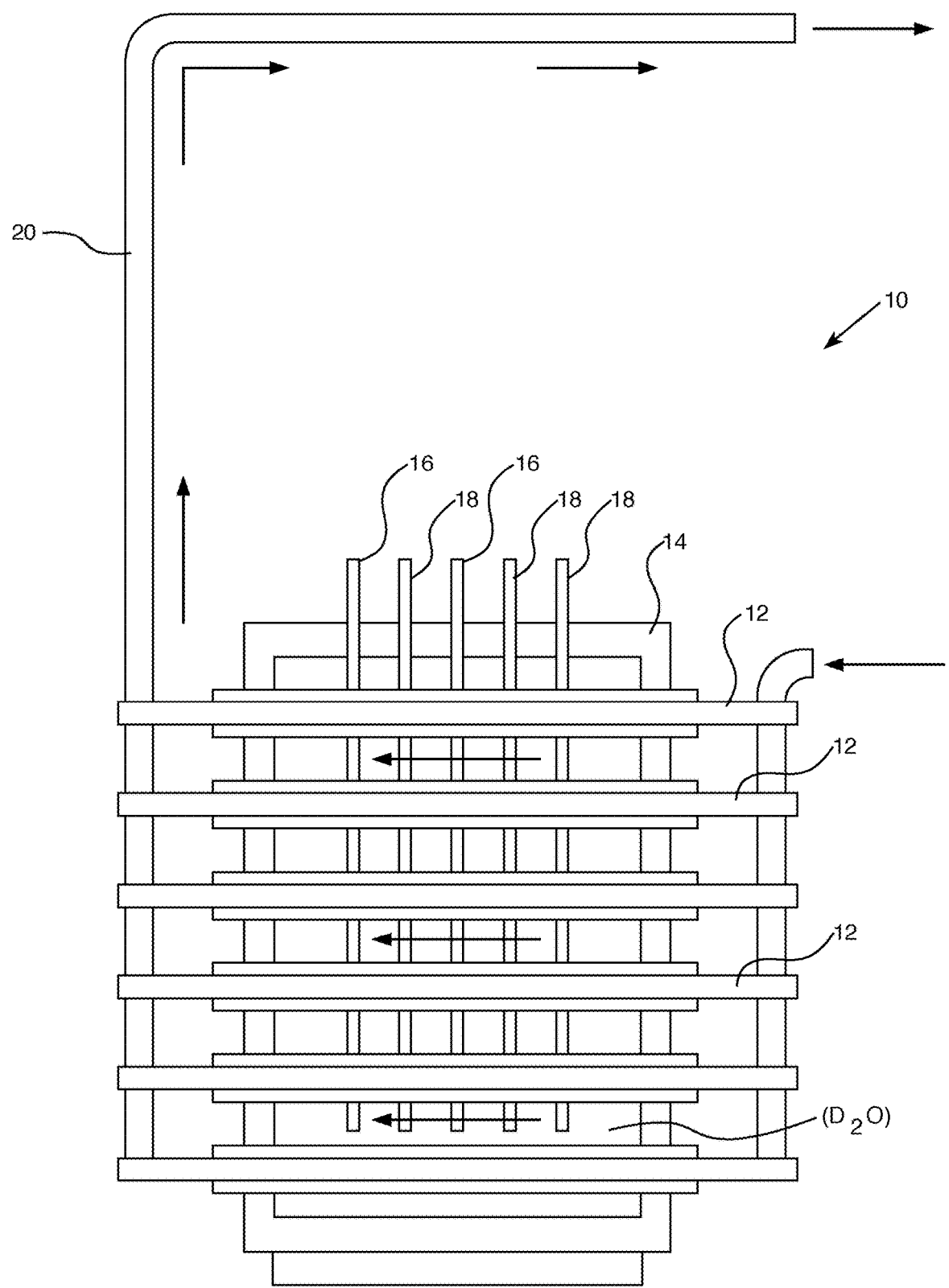
FIG. 1 is a schematic illustration of a portion of a typical CANDU® reactor illustrating the horizontal fuel channels and the vertical control rods and detector channels into which an embodiment of solid state SiC detectors may be installed.

Referring to FIG. 1, a typical CANDU reactor 10 design includes fuel bundles 38 (see FIG. 6) contained in channels 12 that are arranged horizontally in a larger vessel 14 for holding the moderator material, called the calandria. The calandria in a CANDU reactor is heavy water ($D_2O$). A pressurized heavy water coolant flows through the channels 12 around the fuel bundles. Heat generated from the fission reactions in the fuel bundles is transferred to the coolant and the hot water and steam generated flows through pipes 20 to heat exchangers and ultimately to a turbine (not shown) for generating electricity in a well-known reactor design which need not be further described herein. Vertical control rods 16 and detector tubes 18 are positioned perpendicular to the fuel channels 12.

Figure 2:
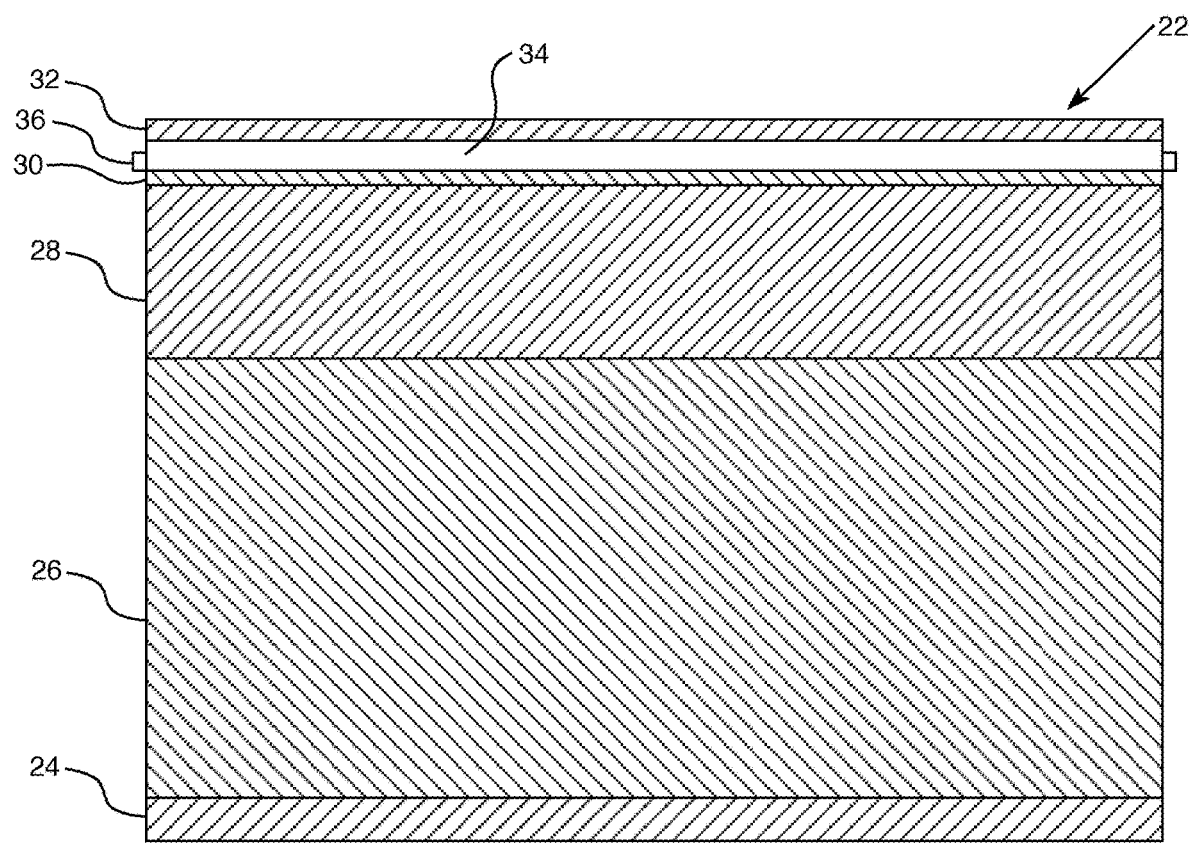
FIG. 2 is a schematic illustration of an embodiment of a silicon carbide diode having a Schotkky contact and a radiation detector with an electron emitter layer.
Figure 3:
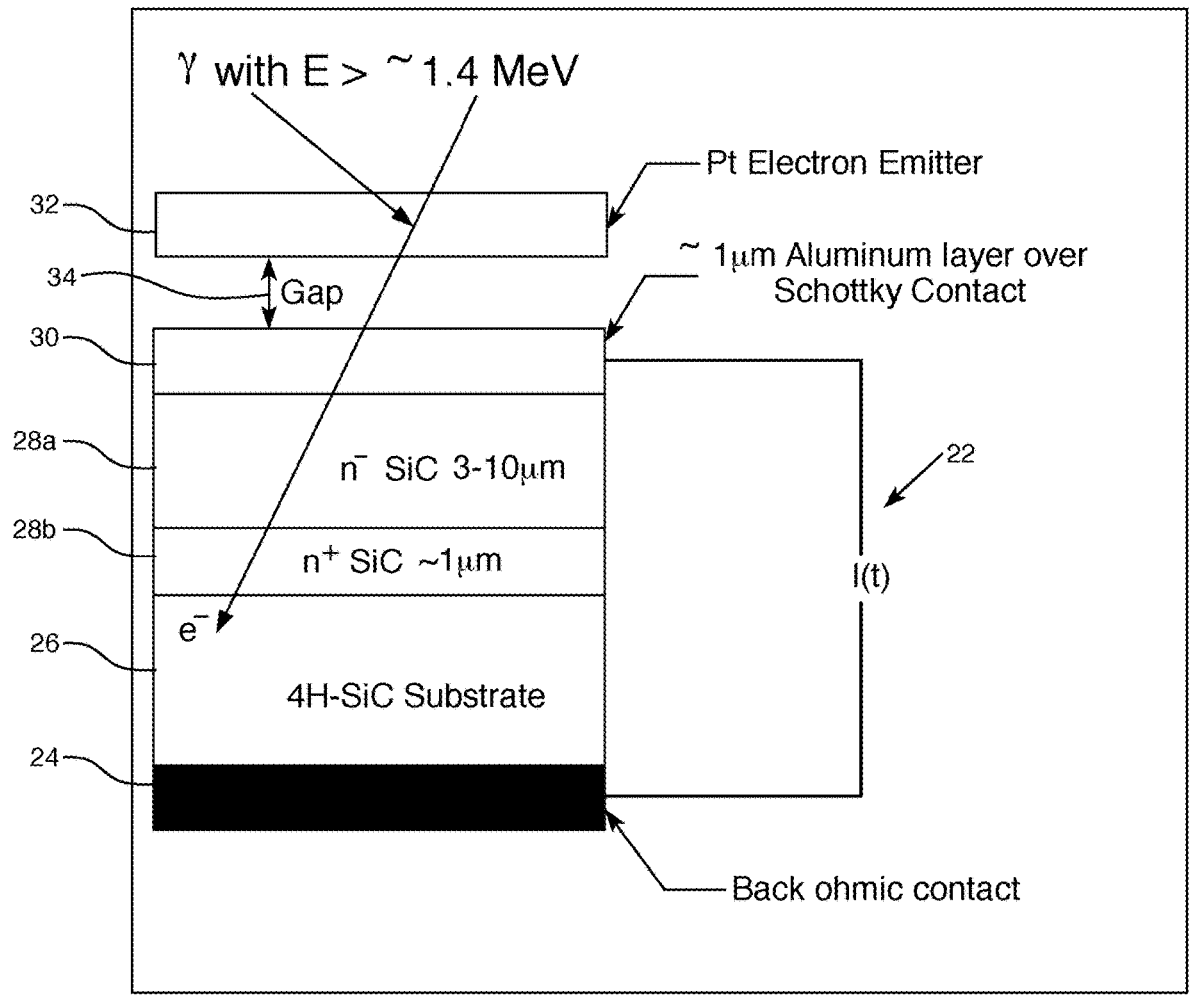
FIG. 3 is a schematic illustration of the silicon carbide detector of FIG. 2 with low level gamma energy discrimination capability.

A method and system are described herein that can be used to quickly detect and precisely determine the in-core location of a fuel bundle containing one or more failed fuel rods in a CANDU®-style nuclear reactor core during operation. Referring to FIGS. 2 and 3, a solid state radiation detector 22 is shown that includes a silicon carbide conducting substrate 26 having an Ohmic contact 24 on one side and at least one epitaxial silicon carbide layer 28 on the other side. The epitaxial silicon carbide layer 28 (or layers 28a and 28b) is covered on its other side by a Schottky contact 30. A top layer of an electron emitter material 32, such as a Compton and photoelectron source material, is separated from the Schottky contact 30 by a gap 34. The detector 22 is based on the device described in U.S. Pat. No. 9,831,375, incorporated herein by reference. The silicon carbide substrate 26, as shown in FIG. 3, may in various aspects include hydrogen ions. The epitaxial silicon carbide layer 28, as stated above, may include two layers, one positively doped layer 28b of about 1 micron in thickness and one negatively doped layer 28a of about 3-10 microns in thickness.

The Schottky contact 30 may in various aspects be formed from platinum or gold. In various aspects, a layer of gold or aluminum about 1 micron in thickness may be formed over at least a portion of the Schottky contact 30. The electron emitter material 32 may in various aspects be formed from a Compton and photoelectron source material such as platinum, or other high Z, or suitable high atomic donor material, such as lithium fluoride, or tungsten that will, in response to incident gamma radiation, release electrons that will penetrate the active region and contribute to the collection of charged particles in the active region. The gap 34 may be a fluid with a low atomic number and little or no conductance, such as air, for example at one atm. pressure and about 20 to 70% relative humidity at 21° C. The distance between the electron emitter layer 32 and the Schottky contact 30 defined by the thickness of gap 34 and the thickness of the electron emitter layer 32 are adjusted, using the method described below, to control the energy range of the gamma radiation to be detected. The gap between the electron emitter 32 and the Schottky contact 30 ensures that only electrons produced by gamma radiation of a desired energy will contribute to the measured signal.

In the method described herein, the minimum detectable gamma radiation energy is associated with the fission product Lanthinum-140 (La-140) that has an energy of approximately 1.4 MeV. The width of the gap 34 between the electron radiator or emitter 32 and the front surface of the active volume of the Schottky contact 30 in the detector 22 is determined from the maximum range of the electrons produced by 1.4 MeV electrons that are generated by Compton interactions at the inner surface of the electron radiator material (e. g.—Platinum), including the fluid between the electron radiator 32 and the diode 30.

The maximum, $R_{max}$, (material independent) of a beta particles can be computed from the following empirical formula given by L. Katz and A. S. Penfold, *Rev. Mod. Phys.*, 24 (1952), p. 28:

$$R_{max}[g/cm^2] = \begin{cases} 0.412 E_\beta^{1.265 - 0.0954 ln(E_\beta)} & 0.01 \le E_\beta \le 2.5 \text{ MeV} \\ 0.530 E_\beta - 0.106 & E_\beta > 2.5 \text{ MeV} \end{cases}$$

where $E_\beta$ is the maximum beta energy in MeV. The ability to stop betas depends primarily on the number of electrons in the absorber (i.e., the areal density, which is the number of electrons per $cm^2$). Hence, the range when expressed as a density thickness ($g/cm^2$) of the material gives a generic quantifier by which various absorbers can be compared. With the maximum range known, the actual shielding thickness required can be computed.

If La-140 gamma energy of 1.4 MeV is used to determine the maximum range of Compton electrons ejected from the electron radiator 32, and the fluid in the gap 34 region is water (density, $\rho$, ~1.0 $gm/cm^3$), the maximum distance the active region of the detector will need to be from the back face of the electron radiator 32 is approximately 0.6 mm.

The addition of an adjustable electron donor layer (symbolically represented in FIG. 2 by a telescoping sleeve surrounding the gap 34), i.e., adjustable in thickness and distance from the Schottky contact 30, allows the gamma radiation to interact with the electrons surrounding the source atoms in the donor material to produce high energy Compton and photoelectrical electrons inside the donor layer that penetrate into the active region of the silicon carbide detector 22. The thickness of the intervening gap 34 between the electron emitter layer 32 and the Schottky contact 30 controls the energy of the donor electrons so that they are collected in the active region.

The gap 34 and electron emitter material layer 32 of the SiC detectors 22 are configured to detect fission products in the coolant indicative of a leak or failure of the fuel bundle. In various aspects, the SiC detectors 22 as used in the method and detector system described herein are configured to be essentially insensitive to any gamma radiation with energy below the energy of that of a selected fission product, such as Lanthanum-140 ($La^{140}$)(~1.4 MeV). $La^{140}$ is one of the most prevalent fission products but the energy of other fission products may be used as the trigger for detector 22 signals. Those skilled in the art know the fission products and the associated energy of each that would be found in a given nuclear reactor.

Figure 4:
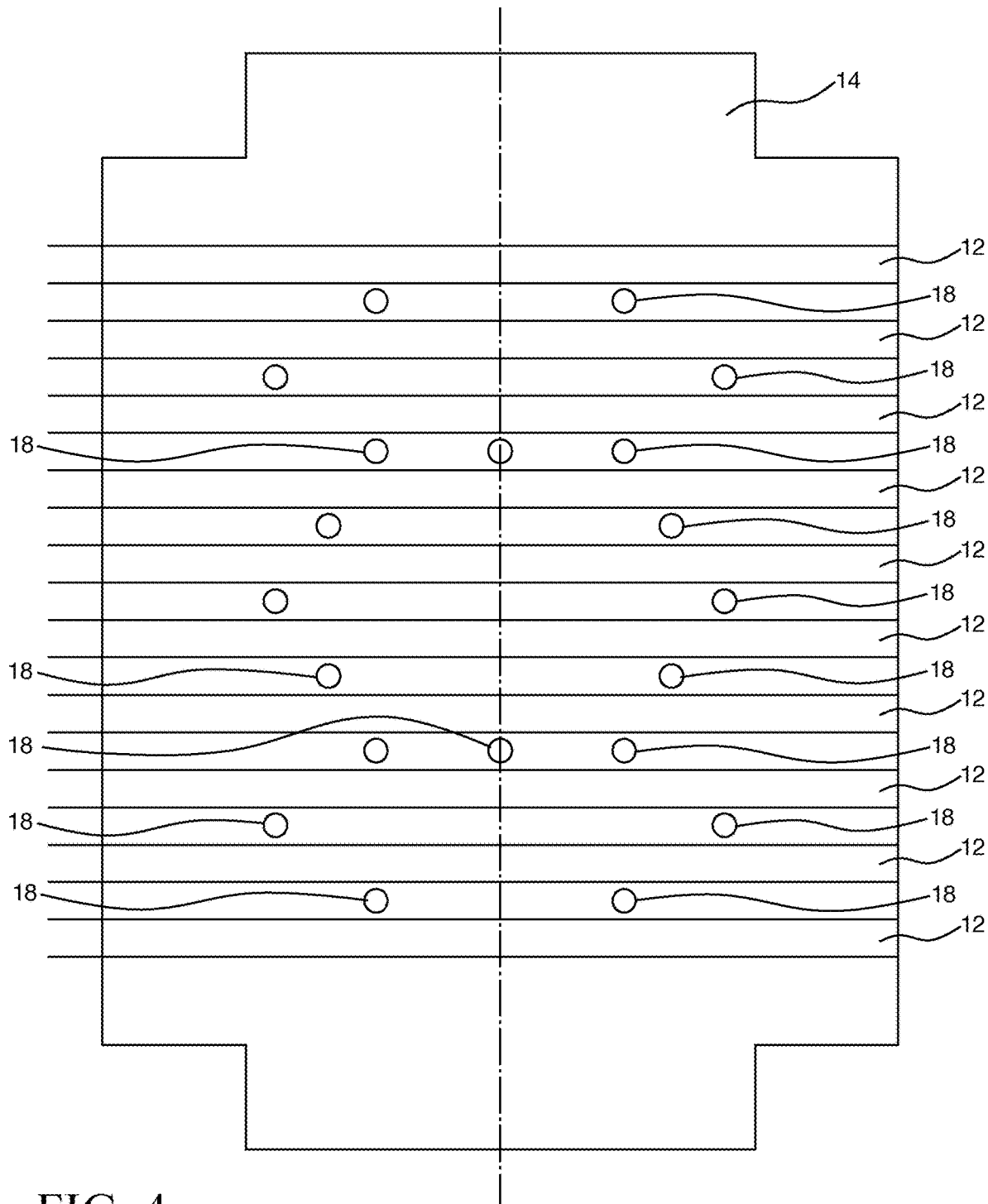
FIG. 4 shows a top view of detector tube positioning in the calandria of a CANDU® reactor showing exemplary multiple detector tubes positioned perpendicular to the fuel channels.

Referring to FIG. 4, a typical CANDU®-style reactor 10 includes a plurality of detector tubes 18 arranged at desired locations perpendicular to the fuel channels 12. Each detector tube 18 contains a plurality of SiC detectors 22. There will be at least two detectors 22 spaced from each other and positioned proximate a fuel channel 12 so that, as explained more fully below, in the event of a spike or increase in a fission product signal from a first detector 22, a difference in the signal strength would be detected from the second detector 22 taking measurements from the same fuel channel. The more detectors 22, the more sensitive the signal differentiation for the system and the better able the system is to detect the presence and source location of a defect in a cladding tube.

Figure 5:
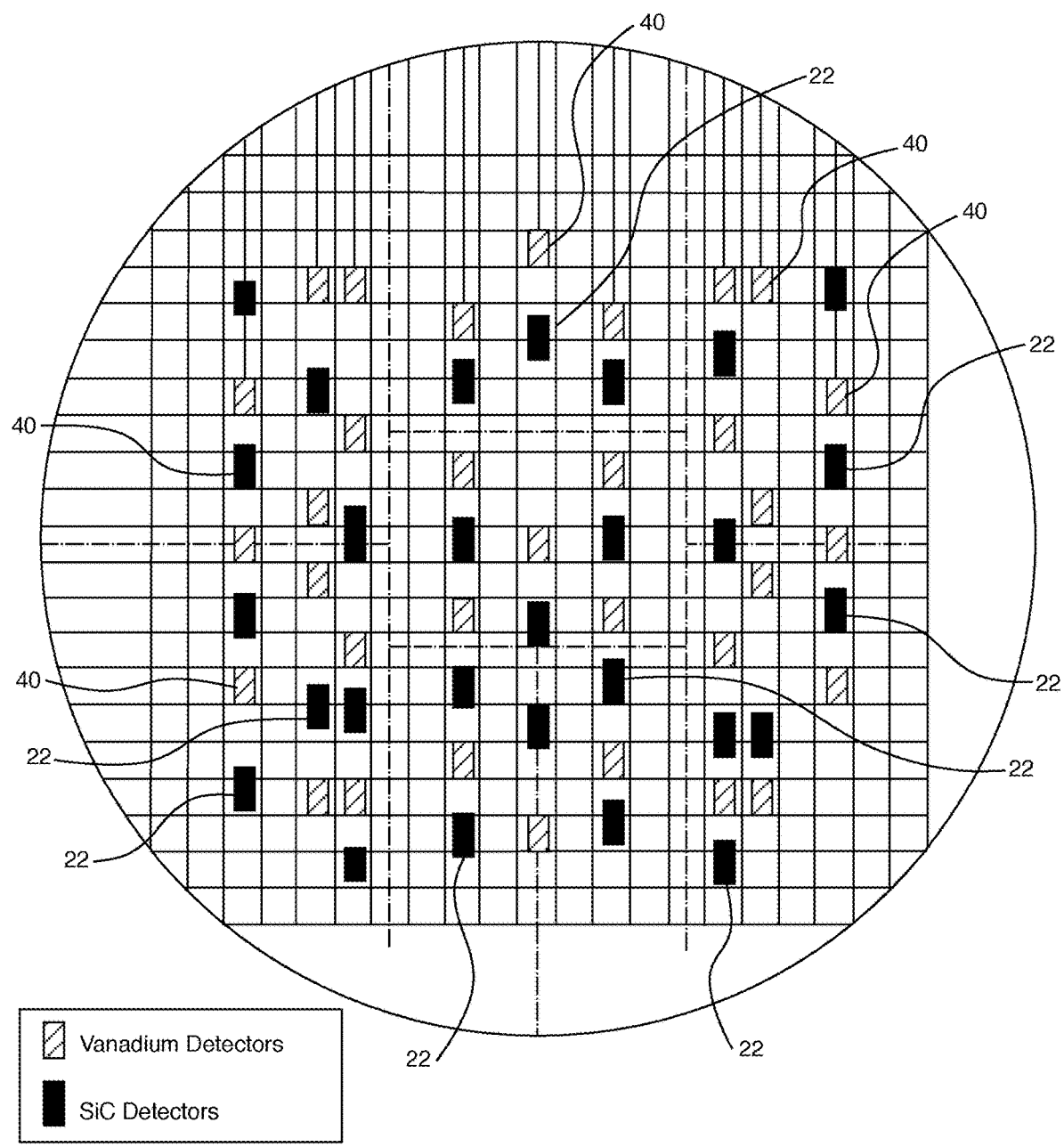
FIG. 5 illustrates exemplary locations for the SiC detectors interspersed with vanadium flux detectors in the detector tubes.
Figure 6:
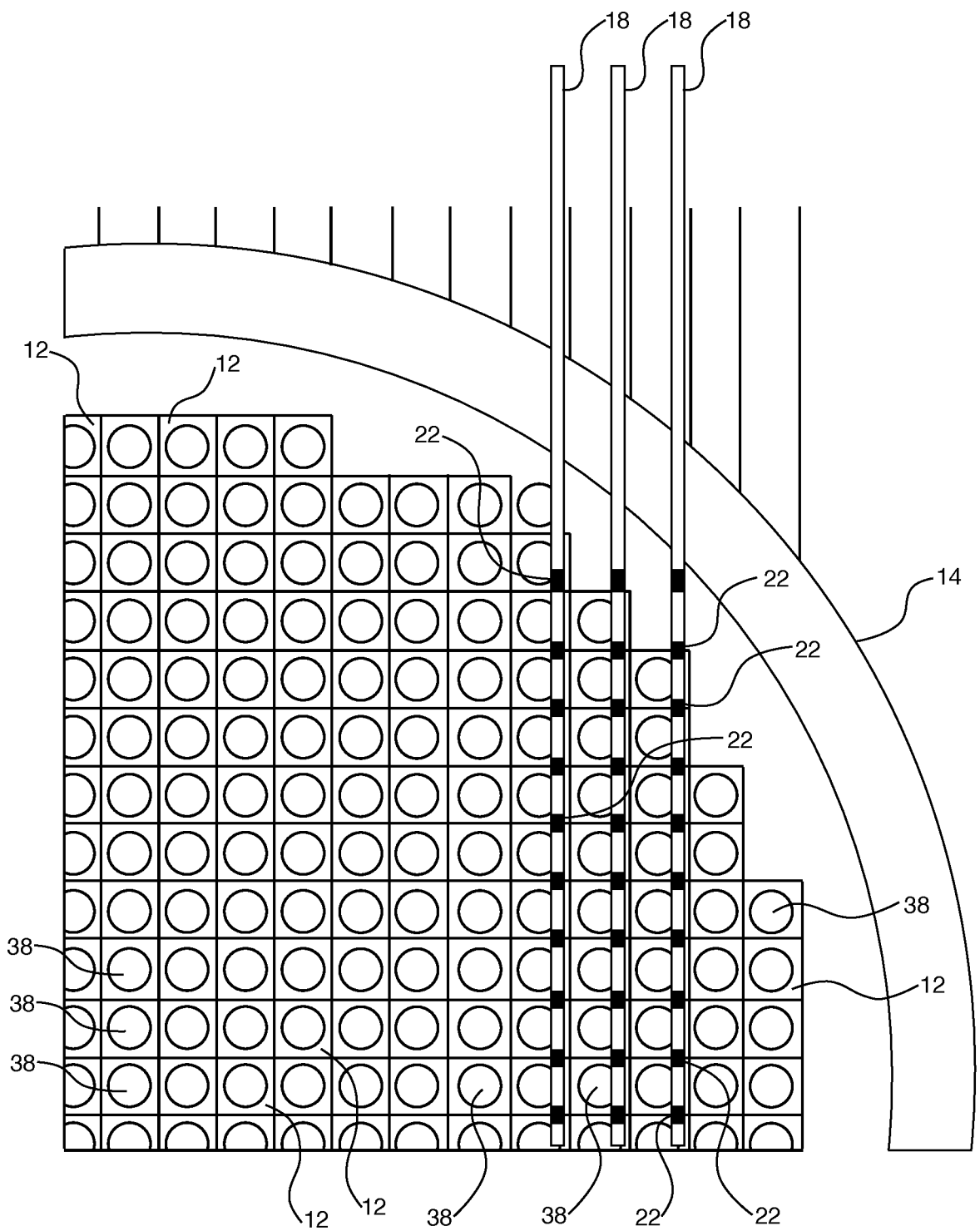
FIG. 6 shows exemplary axial positions of SiC detectors in the detector tubes shown perpendicular to the fuel channels.

In various aspects, the detector tubes 18 will also include one or more vanadium flux detectors 40 (see FIG. 5). The plurality of SiC detectors 22 may be added to existing detector tubes 18 and positioned among the vanadium flux detectors 40 as shown in FIG. 5, or may be the only detectors in a given tube 18, as shown in FIG. 6. A reactor 10 may have detector tubes 18 having both types of detectors 22 and 40 in each tube 18 or may have two sets of tubes 18, one set with only detectors 22 and other set of tubes 18 with only vanadium flux detectors 40.

The detectors 22, in various aspects, are arranged in a fixed linear array optimized to detect changes in the selected fission product, such as $La^{140}$, in the fuel channels 12 of the reactor 10. If the normalized signal level measured by the detectors 22 located at different positions along the length and width of the fuel channels 12 suddenly increase above a baseline value and decrease with time along the length of the fuel channel 12, it is an indication of the presence of a sudden influx of fission products, such as $La^{140}$ into the coolant. The position of the peak change in detector signal along the length of the fuel channel 12, coupled with the time dependent changes in the other detectors 22 positioned along the length of the fuel channel 12, will allow the identification of the offending fuel channel 12 and the particular fuel bundle 38 in that fuel channel emitting the fission product $La^{140}$ into the coolant.

The detection system for CANDU®-style reactors described herein provides a prompt response from the SiC detectors 22 with enhanced gamma radiation sensitivity. Semiconductor radiation detectors, such as the silicon carbide detectors 22, offer several important advantages over other types of detectors such as gas-filled counters. The faster charge-collection times of these solid-state detectors provide them with the ability to process higher counting rates when operated in a pulse mode, and their compact size allows the measurement of intensity gradient profiles over relatively small distances. Pulse mode, as used herein, means that the current produced by the detectors 22 are integrated until a fixed amount of equivalent voltage is collected, that represents a user determined amount of incident gamma radiation using processes well known by those skilled in the art. The higher band gap energy and greater resistance of SiC should theoretically lead to a detector capable of operating at the elevated temperatures and high radiation fields of nuclear reactors. It is for these reasons, SiC detector technology is well-suited for use in detecting and locating failed fuel bundles.

The detection method described herein uses the SiC detectors 22 to selectively measure gamma radiation with energy above the gamma radiation emitted by a selected fission product, such as $La^{140}$ at 1.4 MeV. A sudden increase in the relative levels of gamma radiation with energy above 1.4 MeV (or that of another selected fission product) measured by the SiC detectors 22 along the length of one or more fuel channels indicates an increased presence of fission products in the coolant.

Installation of a plurality of these detectors 22 along the active length of the existing vanadium in-core instrument assemblies inserted into the calandria of a reactor 10, using existing spare or non-utilized openings in the current in-core instrument designs, will create a network of SiC sensors 22 positioned perpendicular to the fuel channels 12 along the length of all of the fuel channels 12. The network of SiC detectors 22 along the length of the fuel channels 12 will allow the time dependent decay of the $La^{140}$ (and other) fission product along the length of the fuel channel 12 to be measured. The locations and magnitudes of the increases in signals from the SiC detectors 22 coupled with the time dependent changes in the SiC detector signals along the length of the fuel channels 12 can be used to triangulate the location of the fuel bundle 38 using known methods. For example, a method of determining the location and intensity of a radiation leak in the context of searching and locating a dirty bomb is disclosed in Nageswara S. V. Rao, et al, *Identification of Low-Level Point Radiation Sources Using a Sensor Network*, Oak Ridge National Laboratory, 2006 (the Rao et al. method).

In FIG. 4, the layout of a typical vanadium flux detector assembly is illustrated. The radiation intensity level changes measured by the SiC detectors 22 interspersed in the array, as shown in FIG. 5, may be used to triangulate the position of the fuel channel 12 containing the fuel bundle 38 with the leaking cladding. The change in measured signal array intensity as a function of time in the direction of the coolant flow transport of the fission product down the length of the fuel channel 12, coupled with the know decay rate of the selected fission product, such as $La^{140}$, can be used by those skilled in the art to enhance the accuracy of the axial position determination. The Rao et al. method presents a description of a technique that may be adapted for use with the SiC detector network to use measured signal intensity changes to determine the location of failed fuel bundle cladding. In practice, the detectors 22 will communicate signals along signal cables, to one or more receivers which communicate the detector readings to a processor that will perform the functions necessary for triangulating the detectors signals for determining the location of the detectors having the strongest normalized signal reading, and thereby the channel 12 and likely cladding tube responsible for the leak. Alternatively, the detector signals can be collected just outside the reactor calandria and wirelessly transmitted via radio frequency signals to receivers inside the containment building for collection and routing to the signal processing equipment located outside the containment building.

An example of the use of this methodology and system may be described as follows. In a reactor 10, the rate of flow of the coolant through the fuel channels 12 will be known and can be continuously or periodically measured, as desired, by known techniques. A fission product that would be expected to be present in sufficient amounts in the event of a leak in a cladding tube to generate measurable gamma radiation is chosen. An exemplary fission product is $La^{140}$ because it is one of the most prevalent fission products in a reactor 10 using $UO_2$ as the fissile material. Those skilled in the art will recognize that other fission products may be selected as the basis for configuring the detectors 22. The SiC detectors 22 are configured by adjusting the depth of the gap 34 and thickness of the electron emitter material 32 so that gamma radiation emissions below the energy of the emissions of the selected fission product will not generate a signal. When the fission product is $La^{140}$, the energy at which a signal would be generated is 1.4 MeV. A plurality of detectors 22 are placed in each detector tube 18, which run perpendicular to the fuel channels 12. A sufficient number of detection tubes 18 are arranged adjacent to and along the length of the fuel channels 12 to detect changes in signals along a given fuel channel. At least two, and preferably many more detectors 22 are placed along the length of the detector tubes 18 adjacent the fuel channels 12. In the event of a leak in a cladding tube in a fuel bundle 38 within a channel 12, the detector 22 nearest the increase in fission products will detect the increase in gamma radiation above an expected normal baseline background level. The coolant flowing past the fuel bundles 38 will carry the fission products with it past the series of additional detectors 22 in detector tubes 18 adjacent the fuel channels 12. Because $La^{140}$ has a short half-life, it will decay quickly and the intensity of the signal from each detector 22 along the flow path of the channel 12 will get weaker as the coolant flow carries the radiation further away from the source of the leak. The simultaneous fractional increases in SiC detector signals occur in the detectors 22 positioned around a specific fuel channel 12. The horizontal position of the maximum amount of increase in each affected SiC detector 22 is determined using a methodology similar to the Rao et al. method, referenced above.

An exponential decay fit of the fractional changes in the measured detector signals nearest to the affected fuel channel 12, starting from the location of the maximum measured detector fractional change would be developed. The process is repeated until the desired statistical confidence in the fitted data is obtained using a sequential probability ratio test as described in Rao. The time constant of the exponential decay fitting obtained is examined to determine whether it is consistent with the decay constant(s) of the target fission product(s). If the assessment is positive, the vertical and horizontal position(s) of the leaking fuel bundles may be determined by triangulation of the maximum fractional SiC detector 22 signals using the methodology described in Rao et al.

The detectors 22 described herein do not require liquid samples be removed from the reactor. The small size of the SiC detectors 22 means that they can utilize the spare and un-used space in the existing detector tube 18 design, avoiding any need to retro-fit existing reactor designs.

The detectors 22 are capable of providing prompt signals that can identify both fission product leakage magnitude and the location of the leaking fuel bundle by triangulation of the changes in relative magnitude and time dependent changes along the length of the reactor fuel channels 12 using known coolant flow rate information. The strings of SiC detectors 22 inserted into the detector tube 18 assemblies can be made to be replaceable during operation, so system reliability and accuracy can be maintained without needing to shut the reactor down.

The signals output from the SiC detectors 22 could be used to continuously and promptly measure the reactor power distribution. As stated above, the vanadium signals have an inherent 15 minute delay. The SiC detectors 22 are capable of emitting signals more promptly upon detection of gamma radiation above that of the selected fission product. The improved ability to locate the leaking fuel bundles 38 will allow a more effective fuel utilization strategy to be implemented that will lower operating costs.

The successful implementation of this detector system described herein will allow the elimination of all costs associated with the equipment, system plumbing, and maintenance needed to support the current methods.

The present invention has been described in accordance with several examples, which are intended to be illustrative in all aspects rather than restrictive. Thus, the present invention is capable of many variations in detailed implementation, which may be derived from the description contained herein by a person of ordinary skill in the art.

All patents, patent applications, publications, or other disclosure material mentioned herein, are hereby incorporated by reference in their entirety as if each individual reference was expressly incorporated by reference respectively. All references, and any material, or portion thereof, that are said to be incorporated by reference herein are incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference and the disclosure expressly set forth in the present application controls.

The present invention has been described with reference to various exemplary and illustrative embodiments. The embodiments described herein are understood as providing illustrative features of varying detail of various embodiments of the disclosed invention; and therefore, unless otherwise specified, it is to be understood that, to the extent possible, one or more features, elements, components, constituents, ingredients, structures, modules, and/or aspects of the disclosed embodiments may be combined, separated, interchanged, and/or rearranged with or relative to one or more other features, elements, components, constituents, ingredients, structures, modules, and/or aspects of the disclosed embodiments without departing from the scope of the disclosed invention. Accordingly, it will be recognized by persons having ordinary skill in the art that various substitutions, modifications or combinations of any of the exemplary embodiments may be made without departing from the scope of the invention. In addition, persons skilled in the art will recognize, or be able to ascertain using no more than routine experimentation, many equivalents to the various embodiments of the invention described herein upon review of this specification. Thus, the invention is not limited by the description of the various embodiments, but rather by the claims.

What is claimed is:

1. A system for detecting a leak in a fuel rod in a fuel bundle in a nuclear reactor having a plurality of horizontally arranged fuel bundles housed in a plurality of horizontally arranged channels for flowing coolant past the fuel bundles, the system comprising:
   a plurality of tubes positioned adjacent to and generally perpendicular to the plurality of channels;
   a plurality of solid state radiation detectors in each of the plurality of tubes, the plurality of radiation detectors spaced from each other along the length of each tube and in proximity to a channel to detect the presence of radiation from a selected fission product within said channel;
   wherein each of the radiation detectors comprise a silicon carbide substrate having a first side and a second side, an Ohmic contact on the second side of the substrate, an epitaxial silicon carbide layer on the first side of the substrate, a Schottky contact covering at least a portion of the epitaxial silicon carbide layer, an electron emitter material spaced from the Schottky contact and defining a gap therebetween, each of the gap and the electron emitter material configured to a depth effective for detecting radiation above a base line level consistent with the presence of the selected fission product; and,
   a processor for receiving radiation signals above the base line level from the plurality of solid state radiation detectors and determining differences in signal strength from multiple detectors over a period of time to identify the location of the detector emitting the strongest signal.

2. The system recited in claim 1 wherein the selected fission product is lanthanum 140.

3. The system recited in claim 1 wherein the base line level is 1.4 MeV.

4. The system recited in claim 1 wherein the electron emitter material is a Compton and photoelectron source material.

5. The system recited in claim 4 wherein the electron emitter material is platinum.

6. The system recited in claim 1 wherein the plurality of radiation detectors are arranged in a fixed linear array within each tube and the plurality of tubes are arranged in fixed positions along the length of each channel.

* * * * *